(12) United States Patent  
Darabi

(10) Patent No.: US 8,126,093 B2
(45) Date of Patent: Feb. 28, 2012

(54) METHOD AND SYSTEM FOR PROCESS, VOLTAGE, AND TEMPERATURE (PVT) CORRECTION

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1537 days.

(21) Appl. No.: 10/976,575

(22) Filed: Oct. 29, 2004

(65) Prior Publication Data

US 2006/0093072 A1    May 4, 2006

(51) Int. Cl.
*H04L 27/08* (2006.01)
(52) U.S. Cl. ........ 375/345; 375/285; 375/346; 330/272; 330/289
(58) Field of Classification Search .................. 375/285, 375/346, 345; 330/289, 272; 455/232.1, 455/234.1

See application file for complete search history.

(56) References Cited

U.S. PATENT DOCUMENTS

| | | | | |
|---|---|---|---|---|
| 4,368,425 A * | 1/1983 | Adams | .......................... | 324/765 |
| 5,373,250 A * | 12/1994 | Gatti et al. | ..................... | 330/277 |
| 5,699,014 A * | 12/1997 | Haefner et al. | ............... | 330/253 |
| 5,923,215 A * | 7/1999 | Hans | ............................. | 330/149 |
| 6,480,061 B2 * | 11/2002 | Dolman et al. | .................... | 330/2 |
| 7,167,045 B1 * | 1/2007 | Son et al. | ....................... | 330/130 |
| 2005/0107054 A1 * | 5/2005 | Nakayama | .................. | 455/234.1 |
| 2005/0258989 A1 * | 11/2005 | Li et al. | .......................... | 341/120 |
| 2005/0276358 A1 * | 12/2005 | Pipilos | ........................... | 375/345 |
| 2007/0112904 A1 | 5/2007 | Kasperkovitz | | |

* cited by examiner

*Primary Examiner* — Shuwang Liu
*Assistant Examiner* — David Huang
(74) *Attorney, Agent, or Firm* — McAndrews, Held & Malloy, Ltd.

(57) ABSTRACT

Certain embodiments of the invention may be found in a method and system for process, voltage, and temperature (PVT) correction. The method may comprise first determining an input voltage of a transistor coupled in an inphase (I) path of a receiver and an input voltage of a transistor coupled in a quadrature (Q) path of said receiver. An amplifier gain setting may be determined from a lookup table based on at least one of a plurality of parameters related to the first determining. A gain of at least one amplifier in the receiver may be adjusted based on the amplifier gain setting determined from the lookup table.

48 Claims, 4 Drawing Sheets

METHOD AND SYSTEM FOR PROCESS, VOLTAGE, AND TEMPERATURE (PVT) CORRECTION

CROSS-REFERENCE TO RELATED APPLICATIONS/INCORPORATION BY REFERENCE

Related Applications

This application is related to the following applications, each of which is incorporated herein by reference in its entirety for all purposes:
U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/977,464 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004.

FIELD OF THE INVENTION

Certain embodiments of the invention relate to the processing of radio signals in a transceiver. More specifically, certain embodiments of the invention relate to a method and system for process, voltage, and temperature (PVT) correction.

BACKGROUND OF THE INVENTION

Today, much of the development and design of radio receivers, transmitter, and/or transceiver systems has been driven by the great demand for devices for mobile wireless communication applications, especially handset devices. With the ever decreasing size of mobile handsets and an ever increasing demand for voice, data, and/or video processing capabilities, there is an growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits, which may be utilized for the processing of signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations generally referred to as process, voltage, and temperature (PVT) variations, may have a significant effect in the overall performance of wireless handsets.

In systems based on the global system for mobile communications (GSM) standard, for example, PVT variations in many of the circuits and/or components utilized in the receiver or the transmitter may produce errors in the generation of "I" (in-phase) and "Q" (quadrature) signal components. These errors may result in a significant degradation in the signal-to-noise ratio (SNR) and/or the bit-error-rate (BER) performance of GSM handsets.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for process, voltage, and temperature (PVT) correction. The method may comprise first determining an input voltage of a transistor coupled in an inphase (I) path of a receiver and an input voltage of a transistor coupled in a quadrature (Q) path of said receiver. An amplifier gain setting may be determined from a lookup table based on at least one of a plurality of parameters related to the first determining. A gain of at least one amplifier in the receiver may be adjusted based on the amplifier gain setting determined from the lookup table. The plurality of parameters may comprise the determined input voltage of the transistor coupled in the I path of the receiver, the determined input voltage of the transistor coupled in the Q path of the receiver, a transconductance of the transistor coupled in the I path of the receiver, a transconductance of the transistor coupled in the Q path of the receiver, a temperature of the transistor coupled in the I path of the receiver and a temperature of the transistor coupled in the Q path of the receiver. The at least one amplifier in the receiver may be a low noise amplifier. The method may comprise adjusting a gain of at least one amplifier in a transmitter based on the amplifier gain setting determined from the lookup table. The at least one amplifier in the transmitter may be a power amplifier. The lookup table may be generated based on the plurality of parameters related to the first determining. The method may comprise detecting a DC offset voltage in the I path of the receiver and/or or the Q path of the receiver. The determined input voltage of the transistor in the I path and/or the Q path of the receiver may be a differential signal.

Another embodiment of the invention may provide a machine readable storage, having stored thereon, a computer program having at least one code section executable by a machine, thereby causing the machine to perform the steps as described above for process, voltage, and temperature (PVT) correction.

In accordance with an embodiment of the invention, a system for process, voltage, and temperature (PVT) correction may be provided. In this regard, the system may comprise circuitry that may be adapted to first determine an input voltage of a transistor that may be coupled in an inphase (I) path of a receiver and determine an input voltage of a transistor that may be coupled in a quadrature (Q) path of the receiver. Circuitry may be adapted to determine an amplifier gain setting from a lookup table based on at least one of a plurality of parameters related to the first determining. The system may further comprise logic, circuitry and/or code that may be adapted to adjust a gain of at least one amplifier in the receiver based on the amplifier gain setting determined from the lookup table. The plurality of parameters may comprise the determined input voltage of the transistor coupled in the I path of the receiver, the determined input voltage of the transistor coupled in the Q path of the receiver, a transconductance of the transistor coupled in the I path of the receiver, a transconductance of the transistor coupled in the Q path of the receiver, a temperature of the transistor coupled in the I path of the receiver and a temperature of the transistor coupled in the Q path of the receiver. The at least one amplifier in the receiver may be a low noise amplifier. The system may further comprise logic, circuitry and/or code that may be adapted to adjust a gain of at least one amplifier in a transmitter based on the amplifier gain setting determined from the lookup table. The at least one amplifier in the transmitter may be a power amplifier. The system may comprise logic, circuitry and/or code that may be adapted to generate the lookup table based on the plurality of parameters related to the first determining. A DC offset sensor may be adapted to detect a DC offset voltage in the I path of the receiver and/or or the Q path of the receiver. The determined input voltage of the transistor in the I path and/or the Q path of the receiver may be a differential signal.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for process, voltage, and temperature (PVT) correction. The method may comprise first determining an input voltage of a transistor coupled in an inphase (I) path of a receiver and an input voltage of a transistor coupled in a quadrature (Q) path of said receiver. An amplifier gain setting may be determined from a lookup table based on at least one of a plurality of parameters related to the first determining. A gain of at least one amplifier in the receiver may be adjusted based on the amplifier gain setting determined from the lookup table.

Figure 1:
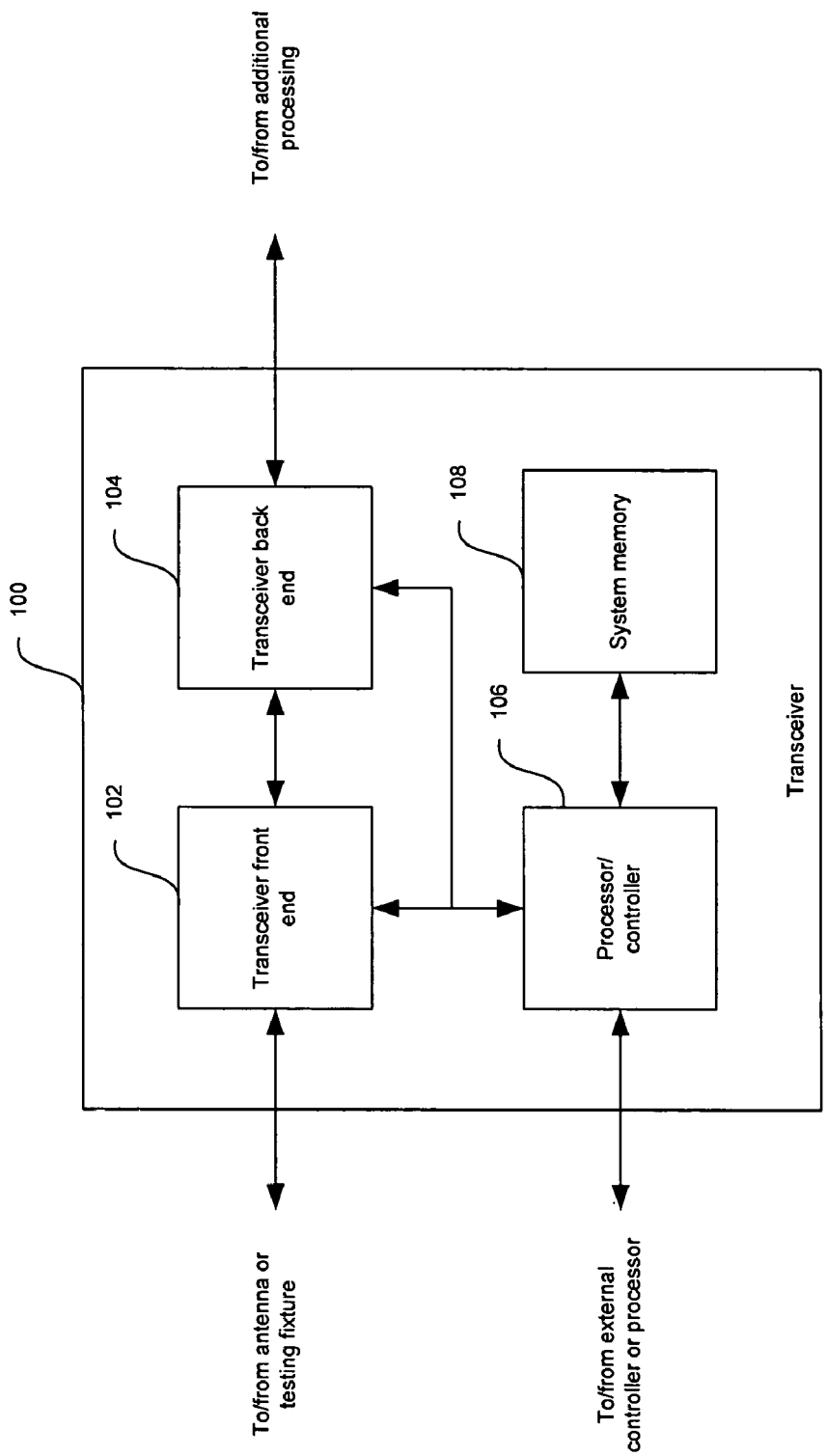
FIG. 1 is a block diagram of an exemplary RF transceiver system, in accordance with an embodiment of the invention.

FIG. 1 is a block diagram of an exemplary RF transceiver system, in accordance with an embodiment of the invention. Referring to FIG. 1, the RF transceiver system 100 may comprise a transceiver front end 102, a transceiver back end 104, a controller/processor 106, and a system memory 108. The transceiver front end 102 may comprise suitable logic, circuitry, and/or code that may be adapted to receive and/or transmit an RF signal. The transceiver front end 102 may comprise a receiver portion and a transmitter portion. Both the transmitter portion and the receiver portion may be coupled to an external antenna for signal broadcasting and signal reception respectively. The transceiver front end 102 may modulate a signal for transmission and may also demodulate a received signal before further processing of the received signal is to take place. Moreover, the transceiver front end 102 may provide other functions, for example, digital-to-analog conversion, analog-to-digital conversion, frequency downsampling, frequency upsampling, and/or filtering.

The transceiver back end 104 may comprise suitable logic, circuitry, and/or code that may be adapted to digitally process received signals from the transceiver front end 104 and/or to process signals received from at least one processing block, which may be located external to the RF transceiver system 100. The controller/processor 106 may comprise suitable logic, circuitry, and/or code that may be adapted to control the operations of the transceiver front end 102 and/or the transceiver back end 104. For example, the controller/processor 106 may be utilized to update and/or modify programmable parameters and/or values in a plurality of components, devices, and/or processing elements in the transceiver front end 102 and/or in the transceiver back end 104. Control and/or data information may be transferred from at least one controller and/or processor external to the RF transceiver system 100 to the controller/processor 106 during the operation of the RF transceiver system 100. Moreover, the controller/processor 106 may also transfer control and/or data information to at least one controller and/or processor external to the RF transceiver system 100.

The controller/processor 106 may utilize the received control and/or data information to determine the mode of operation of the transceiver front end 102. For example, the controller/processor 106 may be adapted to select between measuring and storing a nominal parameter that corresponds to a nominal set of operating PVT conditions or measuring and storing a plurality of parameters that correspond to a plurality of operating PVT conditions. Moreover, the controller/processor 106 may be adapted to determine a value of a transistor transconductance parameter $\beta$, or a value of a parameter that may correspond to $\beta$, as representative of the PVT conditions that existed when the measurement took place. The values determined for $\beta$, and/or for parameters that may correspond to $\beta$, may be transferred to the system memory 108, for example, from the controller/processor 106. The controller/processor 106 may also be adapted to compare a current reading of $\beta$, for example, that corresponds to a current set of PVT operating conditions, to stored readings of $\beta$, that correspond to known PVT operating conditions. This comparison may be utilized to determine whether the operating settings for certain portions of the transceiver front end 102 may need correction as operating conditions vary. The system memory 108 may comprise suitable logic, circuitry, and/or code that may be adapted to store a plurality of control and/or data information, including values that may correspond to readings and/or measurements of the transconductance parameter β performed during PVT measurement and calibration operations.

Figure 2:
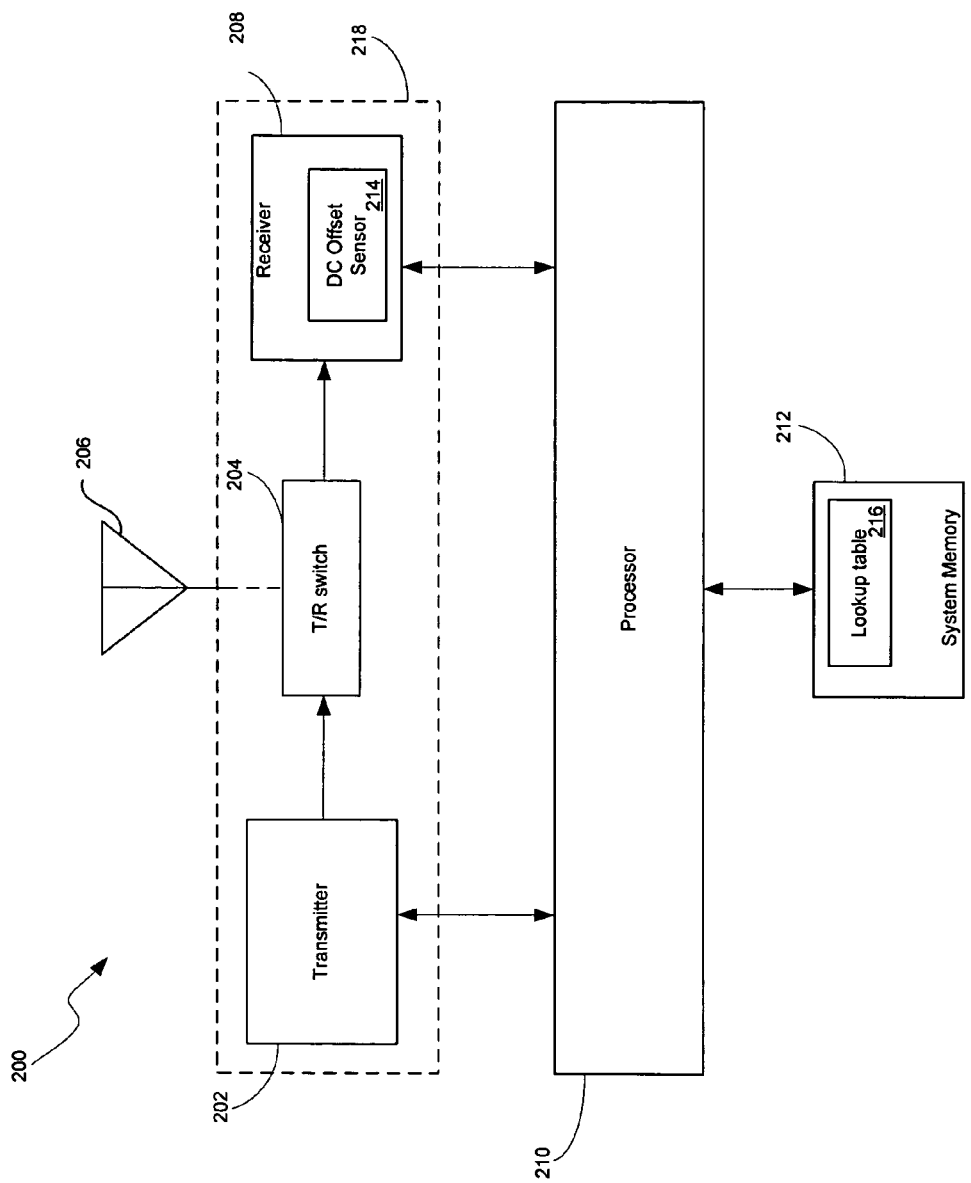
FIG. 2 is a block diagram of an exemplary RF transceiver system illustrating a lookup table, in accordance with an embodiment of the invention.

FIG. 2 is a block diagram of an exemplary RF transceiver system illustrating a lookup table, in accordance with an embodiment of the invention. Referring to FIG. 2, there is shown a system 200 that comprises a transceiver front end 218, an antenna 206, a processor 210 and a system memory 212. The transceiver front end 218 may comprise a transmitter 202, a transmit/receive (T/R) switch 204 and a receiver 208. The receiver 208 may comprise a DC offset sensor 214. The system memory 212 may comprise a lookup table 216.

The transceiver front end 218 may be adapted to modulate a signal for transmission and may also demodulate a received signal before further processing of the received signal. The transmitter 202 may comprise suitable logic and/or circuitry that may be adapted to modulate an information signal to a suitable carrier frequency. The T/R switch 204 may comprise suitable logic, circuitry, and/or code that may be adapted to select between a transmit mode, in which signals may be transferred from the transceiver front end 218, and a receive mode, in which signals may be transferred from either an external antenna or a testing fixture, for example, to the transceiver front end 218. The antenna 206 may be adapted to transmit the processed signals from the transmitter 202 to the receiver 208. The receiver 208 may comprise suitable logic and/or circuitry that may be adapted to receive the processed signals from the transmitter 202. The receiver 208 may comprise a DC offset sensor 214 that may be adapted to sense or detect DC offset levels in the I path and/or the Q path of the receiver 208. The processor 210 may be adapted to receive control and/or data information to determine the mode of operation of the transceiver front end 218. The system memory 212 may comprise suitable logic, circuitry, and/or code that may be adapted to store a plurality of control and/or data information. The lookup table 216 may comprise suitable logic, circuitry and/or code that may be adapted to store values that may correspond to readings and/or measurements of the transconductance parameter β of the transistor coupled in the I path and/or the Q path of the receiver 208, the input voltage of the transistor coupled in the I path and/or the Q path of the receiver 208 and the temperature of the transistor coupled in the I path and/or the Q path of the receiver.

In operation, the DC offset sensor 214 may be adapted to detect a DC offset voltage in the I path and/or the Q path of the receiver 208. The DC offset sensor 214 may transfer a first DC offset current parameter to a first injection circuit coupled in the I path of the receiver 208 and a second DC offset current parameter to a second injection circuit coupled in the Q path of the receiver 208. The transconductance $β_1$ and transconductance $β_2$ of the transistors that may be coupled in the I path and the Q path of the receiver respectively may be determined utilizing the first and second DC offset current parameters.

A lookup table 216 may be generated based on the input voltage, transconductance and the temperature of the transistor that may be coupled in the I path and/or the Q path of the receiver 208. An amplifier gain setting may be determined from the lookup table 216 corresponding to a particular temperature, for example, by comparing the transconductance β and temperature values with a calibrated set of amplifier gain setting values. The gain of at least one amplifier in the receiver, for example, a low noise amplifier may be adjusted based on the amplifier gain setting determined from the lookup table 216. The gain of at least one amplifier in a transmitter, for example, a power amplifier may be adjusted based on the amplifier gain setting determined from the lookup table 216.

Figure 3:
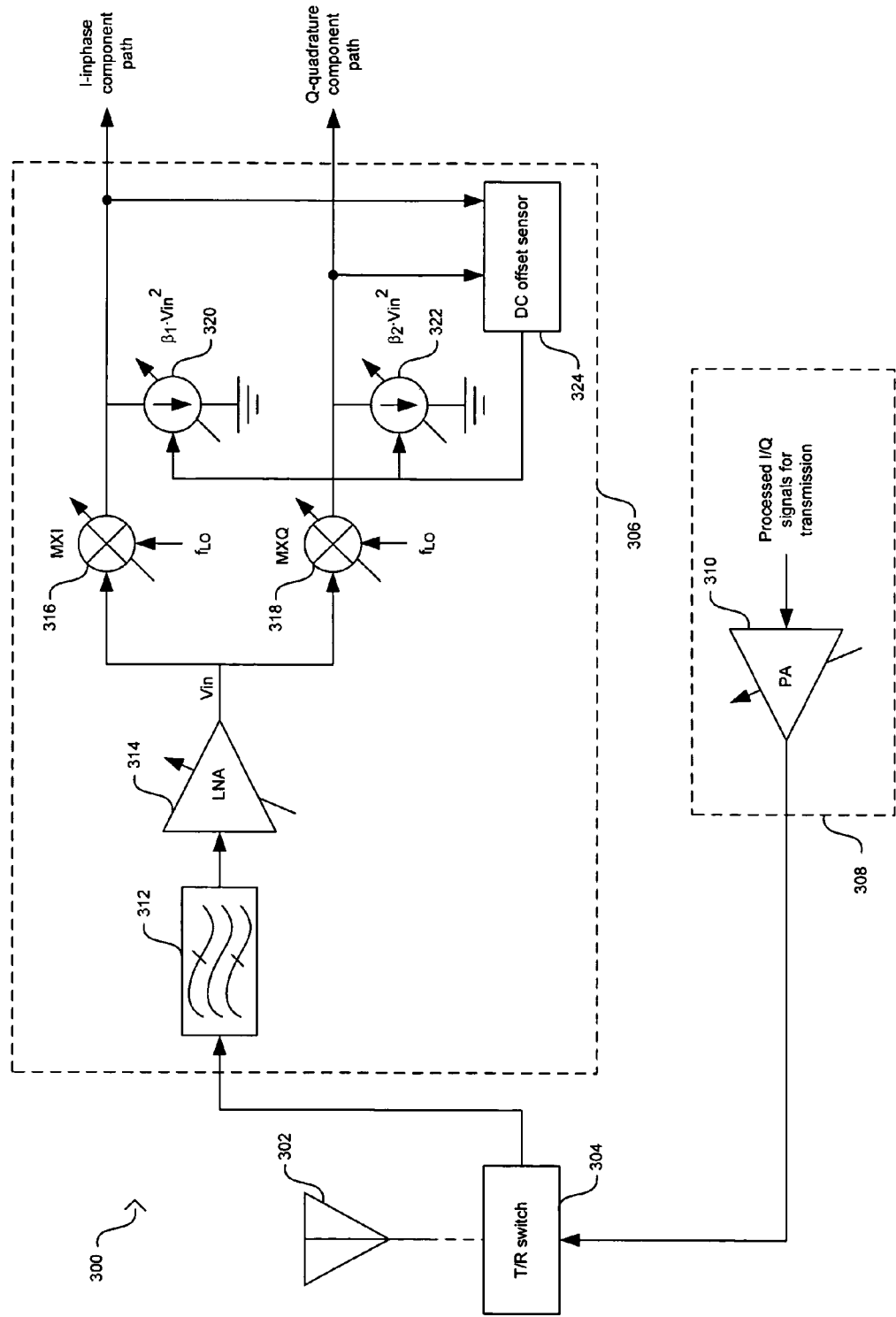
FIG. 3 is a block diagram that illustrates a receiver portion of an exemplary transceiver front end, in accordance with an embodiment of the invention.

FIG. 3 is a block diagram that illustrates a receiver portion of an exemplary transceiver front end, in accordance with an embodiment of the invention. Referring to FIG. 3, the transceiver front end 300 may comprise a transmit/receive (T/R) switch 304 and a receiver portion 306. The T/R switch 304 may comprise suitable logic, circuitry, and/or code that may be adapted to select between a transmit mode, in which signals may be transferred from the transceiver front end 300, and a receive mode, in which signals may be transferred from either an external antenna or a testing fixture, for example, to the transceiver front end 300. Whether the T/R switch 304 selects the transmit mode or the receive mode may be signaled by, for example, the controller/processor 106 in FIG. 1. Regarding the receive mode of operation, FIG. 3 shows an antenna 302 coupled to the T/R switch 304 with a dashed line to indicate that the antenna 302 may be one of a plurality of elements, components, and/or devices that may be coupled to the T/R switch 304.

The receiver portion 306 may comprise a bandpass filter 312, a low noise amplifier (LNA) 314, a "I" component mixer (MXI) 316, a "Q" component mixer (MXQ) 318, a first injection circuit 320, a second injection circuit 322, and a DC offset sensor 324. The receiver portion 306 may not be limited to the elements, components, and/or devices shown in FIG. 3 and may also comprise additional logic, circuitry, and/or code that may be adapted to further process the I/Q signal components. The bandpass filter 312 may comprise suitable logic, circuitry, and/or code that may be adapted to select signals in the bandpass of the channel of interest. The bandpass filter 312 may have a frequency band of 925 to 960 MHz, for example. The LNA 314 may comprise suitable logic, circuitry, and/or code that may be adapted amplify the output of the bandpass filter 312. Certain aspects of the LNA 314 may be programmed by, for example, the controller/processor 106 in FIG. 1. One of these aspects may be the gain applied by the LNA 314 to the output of the bandpass filter 312. In some instances, changing the gain in the LNA 314 may be required to compensate for changes in operating conditions.

The MXI 316 may comprise suitable logic, circuitry, and/or code that may be adapted to mix the output of the LNA 314, Vin, with the local oscillator frequency ($f_{LO}$) to produce a zero intermediate frequency (IF) "I" signal component. The "I" signal component may be a differential signal, for example. Certain aspects of the MXI 316 may be programmed by, for example, the controller/processor 106 in FIG. 1. The MXQ 318 may comprise suitable logic, circuitry, and/or code that may be adapted to mix the output of the LNA 314, Vin, with a local oscillator frequency ($f_{LO}$) to produce a zero IF "Q" signal component. The Q" quadrature signal component may be a differential signal, for example. Certain aspects of the MXQ 318 may be programmed by, for example, the controller/processor 106 in FIG. 1. A variable IF, for example, 100 KHz, 104 KHz, 108 KHz, or 112 KHz, may be utilized to trade between I/Q signal components matching and improving the performance of the receiver portion 306.

The first injection circuit 320 may comprise suitable logic, circuitry, and/or code that may be adapted to apply a first DC offset current on the "I" signal component path. The first DC offset current may be a current which may be expressed as $β_1 \cdot Vin^2$, where $β_1$ is a first proportionality parameter and Vin is the output of the LNA 314, for example. In some instances, the value of Vin may be that of a calibration voltage. The first proportionality parameter, $β_1$, may correspond to a complementary metal oxide semiconductor (CMOS) transconductance parameter representative of a portion of the transistors in the first injection circuit 320 that may be utilized to generate the first DC offset current. The current applied by the first injection circuit 320 may be a differential current, for example. Certain aspects of the first injection circuit 320 may be programmable and may be programmed by, for example, the DC offset sensor 324. Some of these aspects may be the amplitude and polarity of the first DC offset current.

The second injection circuit 322 may comprise suitable logic, circuitry, and/or code that may be adapted to apply a second DC offset current on the "Q" signal component path. The second DC offset current may be a current which may be expressed as $\beta_2 \cdot Vin^2$, where $\beta_2$ is a second proportionality parameter and Vin is the output voltage of the LNA 314. In some instances, the value of Vin may be that of a calibration voltage. The second proportionality parameter, $\beta_2$, may correspond to a CMOS transistor transconductance parameter representative of a portion of the transistors in the second injection circuit 322 that may be utilized to generate the first DC offset current. The current applied by the second injection circuit 322 may be a differential current, for example. Certain aspects of the second injection circuit 322 may be programmable and may be programmed by, for example, the DC offset sensor 324 Some of these aspects may be the amplitude and polarity of the second DC offset current.

The DC offset sensor 324 may comprise suitable logic, circuitry, and/of code that may be adapted to sense or detect DC offset levels in the "I" signal component path and/or the "Q" signal component path in the receiver portion 306. These DC offset levels may be DC offset currents and/or DC offset voltages. The DC offset sensor 324 may generate a parameter that represents the first DC offset current and/or a parameter that represents the second DC offset current based on the sensing or detection of the "I" signal component path and/or the "Q" signal component path respectively. The DC offset current parameters may comprise information regarding the manner in which the injection circuits may generate the DC offset currents and/or information regarding the value of Vin. The DC offset sensor 324 may then transfer the first DC offset current parameter to the first injection circuit 320 and the second DC offset current parameter to the second injection circuit 322. Sensing by the DC offset sensor 324 may be performed at instances which may be determined based on a schedule or as instructed by, for example, the controller/processor 106 in FIG. 1. In some instances, the DC offset sensor 324 may comprise a local memory that may be adapted to store the DC offset current parameters. The DC offset sensor 324 may also transfer the DC offset current parameters to the system memory 108 in FIG. 1 for digital storage via the controller/processor 106, for example. The DC offset sensor 324 may also be utilized to determine variations in circuit performance based on temperature change, operational changes such as voltage variations, and variations in the process utilized during integrated circuit (IC) manufacturing.

Figure 4:
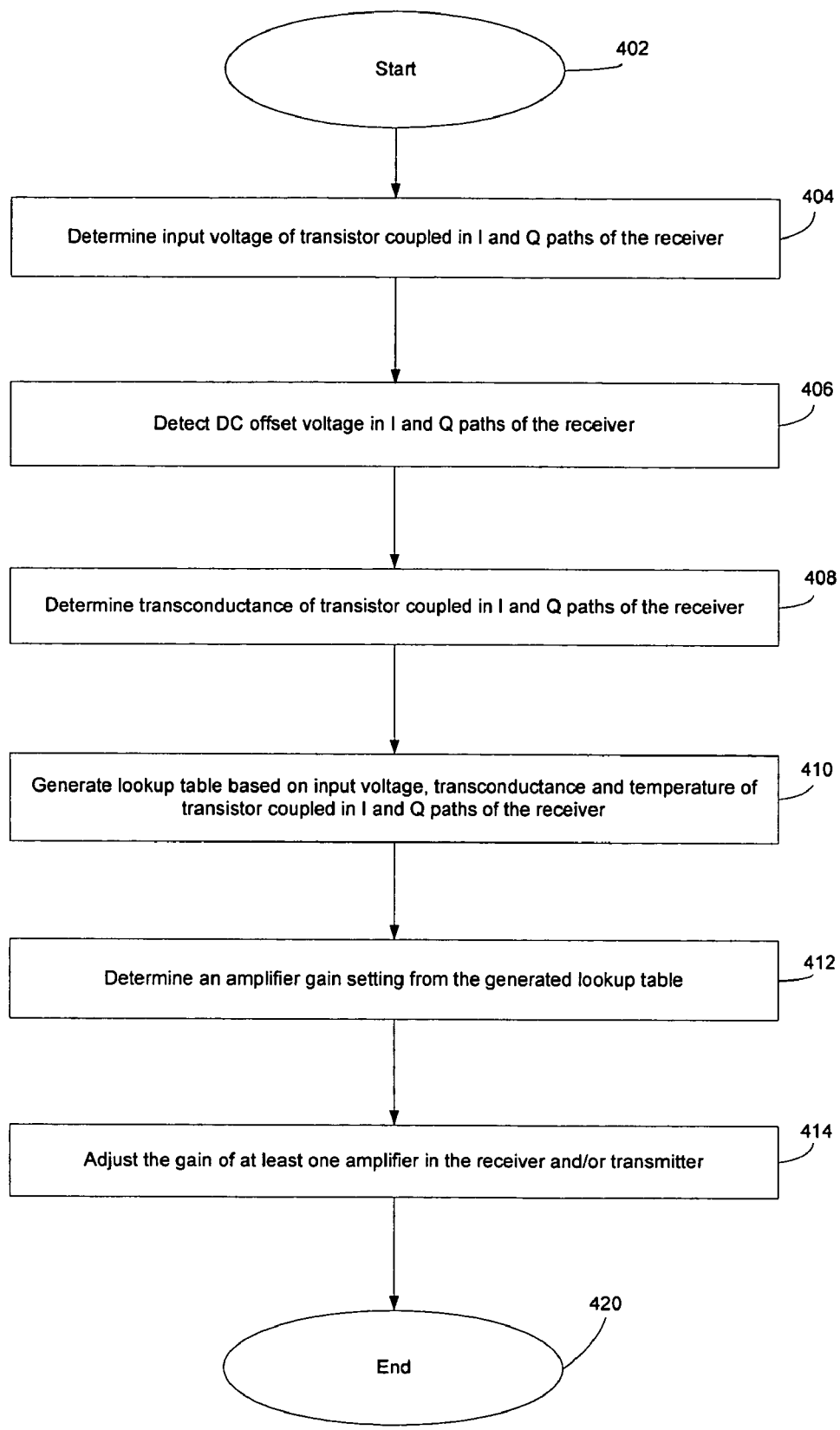
FIG. 4 is a flow diagram illustrating exemplary steps that may be utilized during PVT correction operation, in accordance with an embodiment of the invention.

FIG. 4 is a flow diagram illustrating exemplary steps that may be utilized during PVT correction operation, in accordance with an embodiment of the invention. Referring to FIG. 4, after start step 402, in step 404, the input voltage of a transistor may be determined that may be coupled in an inphase (I) path or a quadrature (Q) path of the receiver. In step 406, the DC offset voltage may be detected in the I path and/or the Q path of the receiver. In step 408, the transconductance $\beta$ of the transistor may be determined that may be coupled in the I path and/or the Q path of the receiver. In step 410, a lookup table may be generated based on the input voltage, transconductance and the temperature of the transistor that may be coupled in the I path and/or the Q path of the receiver. In step 412, an amplifier gain setting may be determined from the lookup table. In step 414, the gain of at least one amplifier in the receiver, for example, a low noise amplifier may be adjusted based on the amplifier gain setting determined from the lookup table. A gain of at least one amplifier in a transmitter, for example, a power amplifier may be adjusted based on the amplifier gain setting determined from the lookup table. The flow diagram may then pass to end step 420.

Sensing and/or measuring the PVT operating conditions may be performed automatically every few milliseconds, for example, and/or when it may be appropriate so as to not interfere with the radio functions of the RF transceiver system 100 in FIG. 1. The PVT measurement may be performed during an idle time in the operation of the RF transceiver system 100, for example. In this regard, the processor/controller 106 in FIG. 1 may be adapted to determine when a PVT measurement may be made. This measurement may be performed to either update the current stored readings and/or to compare the measurements with the current stored readings to determine the current PVT operating conditions. Moreover, the processor/controller 106 may be adapted to control the operation of the RF transceiver system 100 to guarantee that PVT sensing occurs during an idle time.

The approach described above may provide an efficient and accurate determination of the variations in the PVT operating conditions in an RF transceiver.

In accordance with an embodiment of the invention, a system for process, voltage, and temperature (PVT) correction may be provided. In this regard, the system may comprise circuitry that may be adapted to first determine an input voltage of a transistor that may be coupled in an inphase (I) path of a receiver 306 [FIG. 3] or a quadrature (Q) path of the receiver 306. Circuitry may be adapted to determine an amplifier gain setting from a lookup table 216 [FIG. 2] based on a plurality of parameters related to the first determining. The system may further comprise logic, circuitry and/or code that may be adapted to adjust a gain of at least one amplifier, for example a low noise amplifier LNA 314 in the receiver 306 based on the amplifier gain setting determined from the lookup table 216. The plurality of parameters may comprise the determined input voltage of the transistor coupled in the I path of the receiver 306 or the Q path of the receiver 306, a transconductance Do of the transistor coupled in the I path of the receiver 306, a transconductance $\beta_2$ of the transistor coupled in the Q path of the receiver 306, a temperature of the transistor coupled in the I path of the receiver 306 or the Q path of the receiver 306. The system may further comprise logic, circuitry and/or code that may be adapted to adjust a gain of at least one amplifier, for example, a power amplifier 310 in a transmitter based on the amplifier gain setting determined from the lookup table 216. The system may comprise logic, circuitry and/or code that may be adapted to generate the lookup table 216 based on the plurality of parameters related to the first determining. A DC offset sensor 324 may be adapted to detect a DC offset voltage in the I path of the receiver and/or or the Q path of the receiver.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for process, voltage, and temperature (PVT) correction, the method comprising:
    detecting a DC offset level in one or both of: an inphase (I) path of a receiver and/or a quadrature (Q) path of said receiver;
    generating a lookup table based on a determined input voltage, transconductance, and a temperature of a transistor in said receiver, wherein said transconductance of said transistor is determined based on said detected DC offset level;
    determining an amplifier gain setting from said generated lookup table corresponding to said detected DC offset level, based on comparing said determined transconductance of said transistor with a stored transconductance value; and
    adjusting a gain of at least one amplifier in said receiver based on said determined amplifier gain setting.

2. The method according to claim 1, comprising generating said lookup table based on said determined input voltage of said transistor coupled in said I path of said receiver, said determined input voltage of said transistor coupled in said Q path of said receiver, said determined transconductance of said transistor coupled in said I path of said receiver, said determined transconductance of said transistor coupled in said Q path of said receiver, said determined temperature of said transistor coupled in said I path of said receiver, and said determined temperature of said transistor coupled in said Q path of said receiver.

3. The method according to claim 1, comprising determining said input voltage of said transistor coupled in said I path of said receiver.

4. The method according to claim 1, comprising determining said input voltage of said transistor coupled in said Q path of said receiver.

5. The method according to claim 1, comprising determining said transconductance of said transistor coupled in said I path of said receiver.

6. The method according to claim 1, comprising determining said transconductance of said transistor coupled in said Q path of said receiver.

7. The method according to claim 1, comprising determining said temperature of said transistor coupled in said I path of said receiver.

8. The method according to claim 1, comprising determining said temperature of said transistor coupled in said Q path of said receiver.

9. The method according to claim 1, wherein said at least one amplifier in said receiver is a low noise amplifier.

10. The method according to claim 1, comprising adjusting a gain of said at least one amplifier in a transmitter based on said determined amplifier gain setting from said generated lookup table.

11. The method according to claim 10, wherein said at least one amplifier in said transmitter is a power amplifier.

12. The method according to claim 1, comprising generating said lookup table based on said detected DC offset level.

13. The method according to claim 1, wherein said detected DC offset level comprises one or both of: a DC offset voltage and/or a DC offset current in said I path of said receiver.

14. The method according to claim 1, wherein said detected DC offset level comprises one or both of: a DC offset voltage and/or a DC offset current in said Q path of said receiver.

15. The method according to claim 1, wherein said determined input voltage of said transistor coupled in said I path of said receiver is a differential signal.

16. The method according to claim 1, wherein said determined input voltage of said transistor coupled in said Q path of said receiver is a differential signal.

17. A non-transitory machine readable storage having stored thereon, a computer program having at least one code section for process, voltage, and temperature (PVT) correction, the at least one code section being executable by a machine for causing the machine to perform steps comprising:
    detecting a DC offset level in one or both of: an inphase (I) path of a receiver and/or a quadrature (Q) path of said receiver;
    generating a lookup table based on a determined input voltage, transconductance, and a temperature of a transistor in said receiver, wherein said transconductance of said transistor is determined based on said detected DC offset level;
    determining an amplifier gain setting from said generated lookup table corresponding to said detected DC offset level, based on comparing said determined transconductance of said transistor with a stored transconductance value; and
    adjusting a gain of at least one amplifier in said receiver based on said determined amplifier gain setting.

18. The non-transitory machine readable storage according to claim 17, wherein said at least one code section comprises code for generating said lookup table based on said determined input voltage of said transistor coupled in said I path of said receiver, said determined input voltage of said transistor coupled in said Q path of said receiver, said determined transconductance of said transistor coupled in said I path of said receiver, said determined transconductance of said transistor coupled in said Q path of said receiver, said determined temperature of said transistor coupled in said I path of said receiver, and said determined temperature of said transistor coupled in said Q path of said receiver.

19. The non-transitory machine readable storage according to claim 17, wherein said at least one code section comprises code for determining said input voltage of said transistor coupled in said I path of said receiver.

20. The non-transitory machine readable storage according to claim 17, wherein said at least one code section comprises code for determining said input voltage of said transistor coupled in said Q path of said receiver.

21. The non-transitory machine readable storage according to claim 17, wherein said at least one code section comprises code for determining said transconductance of said transistor coupled in said I path of said receiver.

22. The non-transitory machine readable storage according to claim 17, wherein said at least one code section comprises code for determining said transconductance of said transistor coupled in said Q path of said receiver.

23. The non-transitory machine readable storage according to claim 17, wherein said at least one code section comprises code for determining said temperature of said transistor coupled in said I path of said receiver.

24. The non-transitory machine readable storage according to claim 17, wherein said at least one code section comprises code for determining said temperature of said transistor coupled in said Q path of said receiver.

25. The non-transitory machine readable storage according to claim 17, wherein said at least one amplifier in said receiver is a low noise amplifier.

26. The non-transitory machine readable storage according to claim 17, wherein said at least one code section comprises code for adjusting a gain of said at least one amplifier in a transmitter based on said determined amplifier gain setting from said generated lookup table.

27. The non-transitory machine readable storage according to claim 26, wherein said at least one amplifier in said transmitter is a power amplifier.

28. The non-transitory machine readable storage according to claim 17, wherein said at least one code section comprises code for generating said lookup table based on said detected DC offset level.

29. The non-transitory machine readable storage according to claim 17, wherein said detected DC offset level comprises one or both of: a DC offset voltage and/or a DC offset current in said I path of said receiver.

30. The non-transitory machine readable storage according to claim 17, wherein said detected DC offset level comprises one or both of: a DC offset voltage and/or a DC offset current in said Q path of said receiver.

31. The non-transitory machine readable storage according to claim 17, wherein said determined input voltage of said transistor coupled in said I path of said receiver is a differential signal.

32. The non-transitory machine readable storage according to claim 17, wherein said determined input voltage of said transistor coupled in said Q path of said receiver is a differential signal.

33. A system for process, voltage, and temperature (PVT) correction, the system comprising:
one or more processors that are operable to detect a DC offset level in one or both of: an inphase (I) path of a receiver and/or a quadrature (Q) path of said receiver;
said one or more processors are operable to generate a lookup table based on a determined input voltage, transconductance, and a temperature of a transistor in said receiver, wherein said transconductance of said transistor is determined based on said detected DC offset level;
said one or more processors are operable to determine an amplifier gain setting from said generated lookup table corresponding to said detected DC offset level, based on comparing said determined transconductance of said transistor with a stored transconductance value; and
said one or more processors are operable to adjust a gain of at least one amplifier in said receiver based on said determined amplifier gain setting.

34. The system according to claim 33, wherein said one or more processors are operable to generate said lookup table based on said determined input voltage of said transistor coupled in said I path of said receiver, said determined input voltage of said transistor coupled in said Q path of said receiver, said determined transconductance of said transistor coupled in said I path of said receiver, said determined transconductance of said transistor coupled in said Q path of said receiver, said determined temperature of said transistor coupled in said I path of said receiver, and said determined temperature of said transistor coupled in said Q path of said receiver.

35. The system according to claim 33, wherein said one or more processors are operable to determine said input voltage of said transistor coupled in said I path of said receiver.

36. The system according to claim 33, wherein said one or more processors are operable to determine said input voltage of said transistor coupled in said Q path of said receiver.

37. The system according to claim 33, wherein said one or more processors are operable to determine said transconductance of said transistor coupled in said I path of said receiver.

38. The system according to claim 33, wherein said one or more processors are operable to determine said transconductance of said transistor coupled in said Q path of said receiver.

39. The system according to claim 33, wherein said one or more processors are operable to determine said temperature of said transistor coupled in said I path of said receiver.

40. The system according to claim 33, wherein said one or more processors are operable to determine said temperature of said transistor coupled in said Q path of said receiver.

41. The system according to claim 33, wherein said at least one amplifier in said receiver is a low noise amplifier.

42. The system according to claim 33, wherein said one or more processors are operable to adjust a gain of said at least one amplifier in a transmitter based on said determined amplifier gain setting from said generated lookup table.

43. The system according to claim 42, wherein said at least one amplifier in said transmitter is a power amplifier.

44. The system according to claim 33, wherein said one or more processors are operable to generate said lookup table based on said detected DC offset level.

45. The system according to claim 33, wherein said detected DC offset level comprises one or both of: a DC offset voltage and/or a DC offset current in said I path of said receiver.

46. The system according to claim 33, wherein said detected DC offset level comprises one or both of: a DC offset voltage and/or a DC offset current in said Q path of said receiver.

47. The system according to claim 33, wherein said determined input voltage of said transistor coupled in said I path of said receiver is a differential signal.

48. The system according to claim 33, wherein said determined input voltage of said transistor coupled in said Q path of said receiver is a differential signal.

* * * * *